US012699332B2

(12) United States Patent
Luo et al.

(10) Patent No.: US 12,699,332 B2
(45) Date of Patent: Aug. 4, 2026

(54) GAP DETECTION SYSTEM AND METHOD, AND FOCAL PLANE CORRECTION METHOD

(71) Applicant: THE INSTITUTE OF OPTICS AND ELECTRONICS, THE CHINESE ACADEMY OF SCIENCES, Chengdu (CN)

(72) Inventors: Xiangang Luo, Chengdu (CN); Yanqin Wang, Chengdu (CN); Chengwei Zhao, Chengdu (CN); Tiancheng Gong, Chengdu (CN); Changtao Wang, Chengdu (CN); Wenhao Zhang, Chengdu (CN); Yiyun Zhang, Chengdu (CN); Yan Tang, Chengdu (CN)

(73) Assignee: THE INSTITUTE OF OPTICS AND ELECTRONICS, THE CHINESE ACADEMY OF SCIENCES, Chengdu (CN)

( * ) Notice: Subject to any disclaimer, the term of this patent is extended or adjusted under 35 U.S.C. 154(b) by 0 days.

(21) Appl. No.: 19/142,289

(22) PCT Filed: Dec. 27, 2022

(86) PCT No.: PCT/CN2022/142528
§ 371 (c)(1),
(2) Date: Jun. 23, 2025

(87) PCT Pub. No.: WO2024/130764
PCT Pub. Date: Jun. 27, 2024

(65) Prior Publication Data
US 2026/0118783 A1 Apr. 30, 2026

(30) Foreign Application Priority Data
Dec. 23, 2022 (CN) .......................... 202211672168.8

(51) Int. Cl.
*G03F 9/00* (2006.01)
*G03F 7/00* (2006.01)

(52) U.S. Cl.
CPC .......... *G03F 9/703* (2013.01); *G03F 7/70258* (2013.01); *G03F 7/70725* (2013.01);
(Continued)

(58) Field of Classification Search
CPC .. G03F 7/703; G03F 7/70258; G03F 7/70725; G03F 7/70775; G03F 7/7085; G03F 9/7019; G03F 9/7049
(Continued)

(56) References Cited

U.S. PATENT DOCUMENTS 6,144,719 A * 11/2000 Hasegawa ........... G03F 7/70691
378/34
6,495,847 B1 12/2002 Asano et al.
(Continued)

FOREIGN PATENT DOCUMENTS

CN 109426094 A 3/2019
CN 111272089 A 6/2020
(Continued)

OTHER PUBLICATIONS

Junmin Tong et al., Development of Precision Positioning Workpiece Stage in Mask Moving Exposure System, Microfabrication Technology, Jun. 15, 2007, pp. 18-22, No. 03.
(Continued)

*Primary Examiner* — Isiaka O Akanbi

(57) ABSTRACT

A gap inspection system is configured to inspect global gap data between mask and substrate, comprising: support frame; mask frame comprising autofocus module for real-time monitoring gap data between mask and substrate; wafer stage module comprising wafer chuck for adjusting position and orientation of substrate; front-side surface topography
(Continued)

inspection module, mounted on upper substrate of support frame for inspecting the substrate, to acquire primary surface topography parameters; folding surface topography inspection module, switchable between inspection position and retract position for inspecting mask, to acquire secondary surface topography parameters; and control system, configured to acquire position parameters of mask and substrate and calibration parameters of front-side surface topography inspection module and folding surface topography inspection module, and configured to calculate global gap data between mask and substrate in conjunction with position parameters, calibration parameters, primary surface topography parameters, and secondary surface topography parameters after measuring tilt angle between mask and substrate.

10 Claims, 6 Drawing Sheets

(52) U.S. Cl.
CPC ........ *G03F 7/70775* (2013.01); *G03F 7/7085* (2013.01); *G03F 9/7019* (2013.01); *G03F 9/7049* (2013.01)

(58) Field of Classification Search
USPC ................................. 356/498, 496, 399, 401
See application file for complete search history.

(56) References Cited

U.S. PATENT DOCUMENTS

| | | | | |
|---|---|---|---|---|
| 6,559,927 | B1 * | 5/2003 | Tokita | G03F 9/703 |
| | | | | 355/75 |
| 6,842,247 | B1 * | 1/2005 | Wehrens | G03F 7/705 |
| | | | | 356/400 |
| 6,876,438 | B2 * | 4/2005 | Tokita | G03F 9/7026 |
| | | | | 355/72 |
| 7,740,992 | B2 * | 6/2010 | Inao | G03F 7/7035 |
| | | | | 430/5 |
| 9,459,093 | B2 * | 10/2016 | Sato | G01B 11/2441 |
| 11,221,562 | B2 * | 1/2022 | Lee | G03F 7/707 |
| 11,982,521 | B2 * | 5/2024 | Smith | G02B 5/1871 |
| 12,197,136 | B2 * | 1/2025 | Tel | G03F 7/70525 |
| 2003/0230730 | A1 * | 12/2003 | Tokita | G03F 9/7026 |
| | | | | 250/492.2 |
| 2014/0106264 | A1 * | 4/2014 | Campidell | G03F 7/20 |
| | | | | 430/5 |
| 2016/0131983 | A1 * | 5/2016 | Holovinger | G03F 7/70633 |
| | | | | 356/401 |
| 2023/0129163 | A1 * | 4/2023 | Luo | G03F 7/70716 |
| | | | | 355/72 |

FOREIGN PATENT DOCUMENTS

| | | |
|---|---|---|
| CN | 113311671 A | 8/2021 |
| JP | H10289870 A | 10/1998 |
| JP | 2013195531 A | 9/2013 |

OTHER PUBLICATIONS

International Search Report of PCT Patent Application No. PCT/CN2022/142528 issued on Jul. 20, 2023.

Written Opinion of PCT Patent Application No. PCT/CN2022/142528 issued on Jul. 20, 2023.

* cited by examiner

GAP DETECTION SYSTEM AND METHOD, AND FOCAL PLANE CORRECTION METHOD

The present disclosure claims priority to Chinese patent application No. 202211672168.8, filed on Dec. 23, 2022, the entire contents of which are incorporated herein by reference.

TECHNICAL FIELD

The present disclosure relates to the technical field of optical inspections, and specifically relates to a gap inspection system and a method, and a focal plane correction method.

BACKGROUND ART

In a state of contact, proximity, or small gap between the mask and the substrate, the traditional off-axis triangulation method is completely incompatible with small gap inspection optics. The traditional white light interference gap inspection method can only realize the three-point focal plane inspection, and it is far away from the pattern region of mask, which cannot fully and accurately represent the focal plane information of the exposure field. Although the traditional in-situ gap inspection method can inspect the focal plane information in the pattern region of the mask, the dot-matrix fiber arrangement is spatially constrained, realizing the inspection of the focal plane information only at discrete sampling positions. A more prominent problem is that the method requires processing the inspection window on the mask, but the mask pattern cannot be designed at the inspection window position, which will seriously affect the layout of the mask pattern, thereby reducing the integration of the pattern.

SUMMARY

(1) Technical Problem to be Solved

In response to the above problems, the present disclosure provides a gap inspection system and a method, and a focal plane correction method to solve technical problems such as limited inspection space, small inspection area, and influence on the layout of the mask pattern by traditional methods.

(2) Technical Solutions

In one aspect, the present disclosure provides a gap inspection system, configured to inspect global gap data between a mask and a substrate, including: a support frame; a mask frame, including an autofocus module for real-time monitoring the gap data between the mask and the substrate; a wafer stage module, including a wafer chuck for adjusting a position and an orientation of the substrate; a front-side surface topography inspection module, mounted on an upper substrate of the support frame for inspecting the substrate, to acquire primary surface topography parameters; a folding surface topography inspection module, switchable between an inspection position and a retract position for inspecting the mask, to acquire secondary surface topography parameters; and a control system, configured to acquire position parameters of the mask and the substrate and calibration parameters of the front-side surface topography inspection module and the folding surface topography inspection module, and configured to calculate global gap data between the mask and the substrate in conjunction with the position parameters, the calibration parameters, the primary surface topography parameters, and the secondary surface topography parameters after measuring a tilt angle between the mask and the substrate.

Further, the mask frame further includes: a support plate, mounted on the upper substrate of the support frame, and a mask holder, mounted on the support plate, wherein the mask is vacuum-chucked on the mask holder and the autofocus module is mounted on the support plate.

Further, the wafer stage module further includes: a coarse stage, mounted on a lower substrate of the support frame, and a fine stage, mounted on the coarse stage, wherein the coarse stage and the fine stage are configured to adjust the position and the orientation of the substrate, and a wafer chuck is mounted on the fine stage.

Further, the front-side surface topography inspection module is one of a mechanical phase-shifting laser interferometer, a dynamic phase-shifting laser interferometer, a Twyman-Green-type dynamic phase-shifting interferometer, and a short-coherence Fizeau-type laser interferometer.

Further, the folding surface topography inspection module includes: a position adjustment mechanism, mounted on a side substrate of the support frame and configured to drive the folding surface topography inspection module to switch between an inspection position and a retract position; and a surface topography inspection lens group, a beam-steering mirror group, and a reference mirror group, for optical path deflection by 90° to enable surface topography inspection of the mask.

Further, the folding surface topography inspection module is an upright folding surface topography inspection module or an inverted folding surface topography inspection module, and the folding surface topography inspection module moves linearly or rotationally by a position adjustment mechanism, so as to switch between the inspection position and the retract position.

Further, the gap inspection system further includes: a vibration-isolated foundation and an active vibration isolation platform, constituting a system frame together with the support frame for providing a stable metrology reference base and structural mounting interface.

Another aspect of the present disclosure provides a method for gap inspection based on the forgoing gap inspection system, including: S1, calibrating relative positional relationships of the mask, the substrate, the front-side surface topography inspection module, and the folding surface topography inspection module, to acquire position parameters of the mask and the substrate; S2, calibrating the front-side surface topography inspection module and the folding surface topography inspection module by using an interferometric absolute flatness reference standard, to acquire the calibration parameters; S3, inspecting the substrate by using the front-side surface topography inspection module to obtain the primary surface topography parameters; S4, inspecting the mask by using the folding surface topography inspection module to obtain the secondary surface topography parameters; and S5, switching the folding surface topography inspection module to the retract position and moving the substrate to the global gap inspection position to obtain the gap data between the mask and the substrate by using the autofocus module, performing precise leveling on the mask and the substrate according to the gap data, and calculating the global gap data between the mask and the substrate according to the position parameters, the calibration parameters, the primary surface topography parameters, and the secondary surface topography parameters; or, switching the folding surface topography inspection module to the retract position and moving the substrate to the global gap inspection position to obtain the gap data between the mask and the substrate by using the autofocus module, calculating the tilt angle between the mask and the substrate, and then calculating the global gap data between the mask and the substrate according to the position parameters, the calibration parameters, the tilt angle, the primary surface topography parameters, and the secondary surface topography parameters.

Further, the front-side surface topography inspection module is a small-aperture surface topography inspection module, and the S3 includes: performing a full-aperture stitching inspection on the substrate by using the small-aperture surface topography inspection module, to acquire surface topography parameters of each stitched sub-area; using surface topography parameters of a non-overlapping region as primary stitching data at the non-overlapping region of the stitched sub-area, and using surface topography parameters of a stitched sub-area corresponding to a region away from the edge of the stitched sub-area as secondary stitching data at an overlapping region of the stitched sub-area; and merging the primary stitching data and the secondary stitching data to obtain the primary surface topography parameters.

Another aspect of the present disclosure provides a method of performing focal plane correction according to the forgoing gap inspection system, including: S1, calibrating relative positional relationships of the mask, the substrate, the front-side surface topography inspection module, and the folding surface topography inspection module, to acquire position parameters of the mask and the substrate; S2, calibrating the front-side surface topography inspection module and the folding surface topography inspection module by using an interferometric absolute flatness reference standard, to acquire the calibration parameters; S3, inspecting the substrate by using the front-side surface topography inspection module to obtain the primary surface topography parameters; S4, inspecting the mask by using the folding surface topography inspection module to obtain the secondary surface topography parameters; S5, switching the folding surface topography inspection module to the retract position and moving the substrate to the global gap inspection position to obtain the gap data between the mask and the substrate by using the autofocus module, performing precise leveling on the mask and the substrate according to the gap data, and then calculating the global gap data between the mask and the substrate according to the position parameters, the calibration parameters, the primary surface topography parameters, and the secondary surface topography parameters; or, switching the folding surface topography inspection module to the retract position and moving the substrate to the global gap inspection position to obtain the gap data between the mask and the substrate by using the autofocus module, calculating the tilt angle between the mask and the substrate, and then calculating the global gap data between the mask and the substrate according to the position parameters, the calibration parameters, the tilt angle, the primary surface topography parameters, and the secondary surface topography parameters; and S6, performing the focal plane correction according to the global gap data, so that an upper surface of the substrate is located on a target focal plane.

(3) Beneficial Effects

The gap inspection system and method, and the focal plane correction method are provided by the present disclosure. By using the front-side surface topography inspection module to acquire the primary surface topography parameters of the substrate and using the folding surface topography inspection module to acquire the mask of the secondary surface topography parameters, in conjunction with the position parameters of the mask and the substrate and the calibration parameters of the front-side surface topography inspection module and the folding surface topography inspection module, the global gap data between the mask and the substrate can be obtained, which realizes the nanometric precision inspection of the focal plane in the exposure field, thereby solving the problem of inaccurate measurement results obtained by using a single measurement point outside the pattern region, and also solving the problem of affecting the pattern layout of the mask when fabricating openings in the pattern region of the mask.

REFERENCE NUMBERS

1, vibration-isolated foundation; 2, active vibration isolation platform; 3, support frame; 4, mask frame; 4-1, support plate; 4-2, mask holder; 4-3, mask; 4-4, autofocus module; 5, wafer stage module; 5-1, coarse stage; 5-2, fine stage; 5-3, wafer chuck; 5-4, substrate; 6, front-side surface topography inspection module; 7A, upright folding surface topography inspection module; 7B, inverted folding surface topography inspection module; 7-1, position adjustment mechanism; 7-2, surface topography inspection lens group; 7-3, beam-steering mirror group; 7-4, reference mirror group; and 8, control system.

DETAILED DESCRIPTION OF EMBODIMENTS

In order to make the purpose, technical solution, and advantages of the present disclosure clearer and more explicit, the present disclosure is further described in detail in conjunction with specific embodiments and with reference to drawings.

The terms used herein are merely for describing the specific embodiments and are not intended to limit the present disclosure. The terms "include", and "comprise" used herein indicate the existence of the features, steps, operations, and/or components, but do not exclude the existence or addition of one or more other features, steps, operations, or components.

It should be noted that if the directional indication is involved in the embodiments of the present disclosure, the directional indication is only used to explain the relative positional relationship and movement conditions of each component under a specific orientation. If the specific orientation is changed, the directional indication is correspondingly changed.

The ordinal numbers used in the specification and claims, such as "first", "second", "third", etc., are used to modify the corresponding components. They do not imply or represent any ordinal number of the component itself, nor do they represent the sequence of one component with another or the sequence of manufacturing methods. The use of these ordinal numbers is only to differentiate a component with a certain name to be clearly from another component with the same name.

As for difficulties faced in the inspection of the exposure focal plane, the present disclosure provides a system and method for inspecting the gap between plates. The method uses surface topography parameters of the substrate and the mask, in conjunction with the precision positional calibration and overall gap inspection and adjustment, so as to realize the inspection of the gap between the substrate and the mask in the exposure field.

Figure 1:
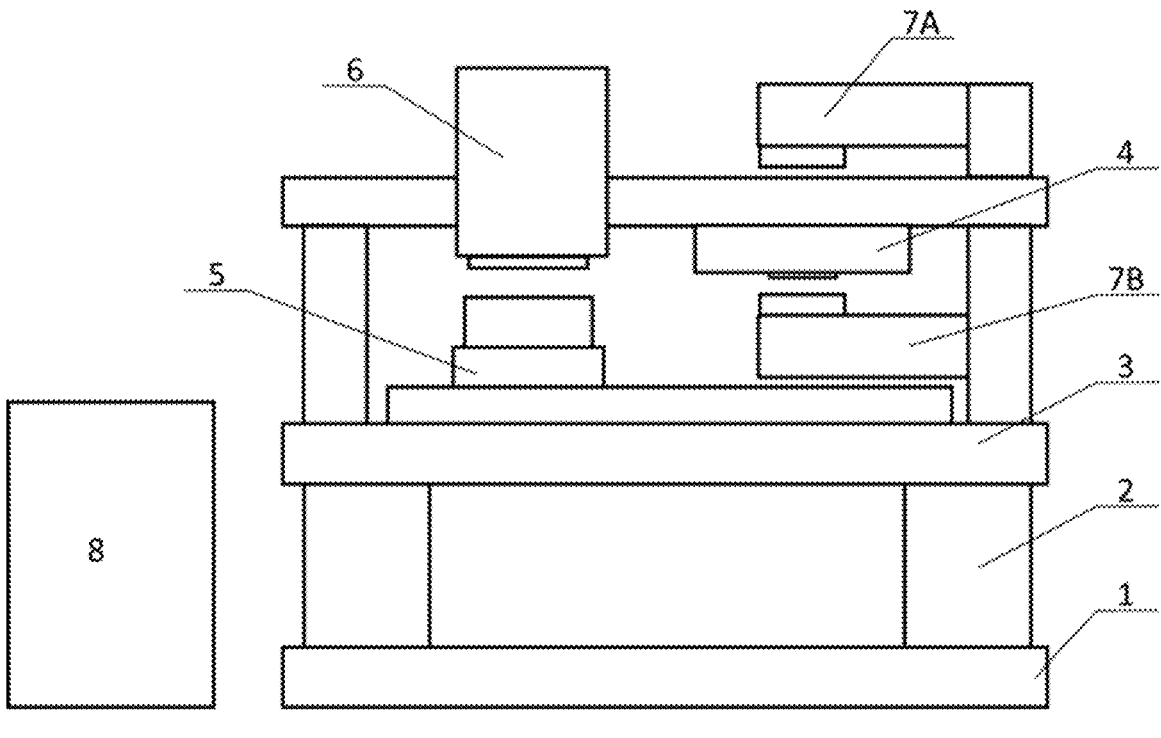
FIG. 1 schematically shows a structure schematic diagram of a gap inspection system according to the embodiments of the present disclosure.
Figure 2:
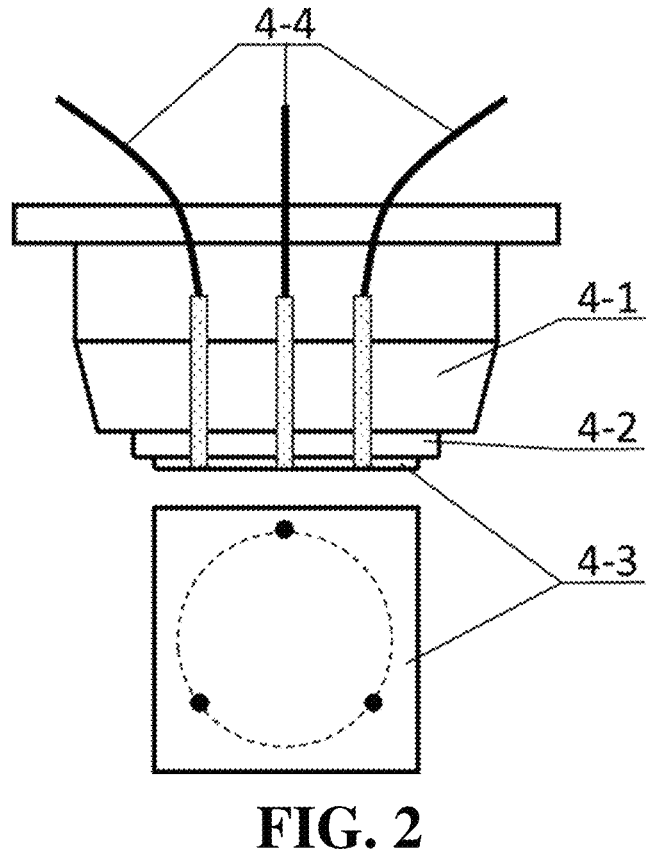
FIG. 2 schematically shows a structure schematic diagram of a mask frame in a gap inspection system according to the embodiments of the present disclosure.
Figure 3:
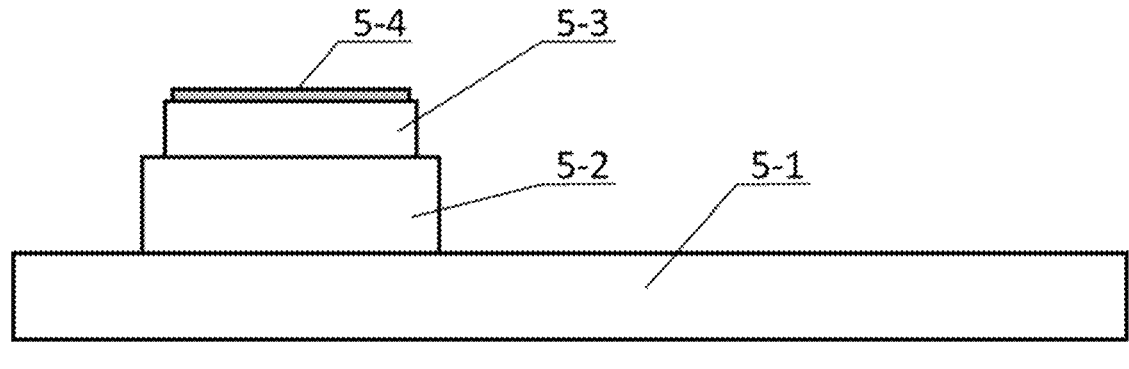
FIG. 3 schematically shows a structure schematic diagram of a wafer stage module in a gap inspection system according to the embodiments of the present disclosure.

The present disclosure provides a gap inspection system, which is configured to inspect global gap data between a mask 4-3 and a substrate 5-4. Referring to FIG. 1 to FIG. 3, the system includes: a support frame 3; a mask frame 4 including an autofocus module 4-4 for real-time monitoring the gap data between the mask and the substrate; a wafer stage module 5 including a wafer chuck 5-3 for adjusting a position and an orientation of the substrate 5-4; a front-side surface topography inspection module 6 mounted on an upper substrate of the support frame 3 for inspecting the substrate 5-4, to acquire primary surface topography parameters; a folding surface topography inspection module, switchable between an inspection position and a retract position for inspecting the mask 4-3, to acquire secondary surface topography parameters; and a control system 8, configured to acquire position parameters of the mask 4-3 and the substrate 5-4 and calibration parameters of the front-side surface topography inspection module 6 and the folding surface topography inspection module, and configured to calculate global gap data between the mask 4-3 and the substrate 5-4 in conjunction with the position parameters, the calibration parameters, the primary surface topography parameters, and the secondary surface topography parameters after measuring a tilt angle between the mask 4-3 and the substrate 5-4.

After loading the mask 4-3 and the substrate 5-4, the front-side surface topography inspection module 6 is located above the substrate 5-4 to obtain the primary surface topography parameters of the substrate 5-4, and the folding surface topography inspection module is located above or below the mask 4-3 (i.e., the inspection position) to obtain the secondary surface topography parameters of the mask 4-3. Later, the folding surface topography inspection module is switched to the retract position, and the substrate 5-4 is carried by the wafer stage module 5 to move to the global gap inspection position. Through monitoring the gap data between the mask 4-3 and the substrate 5-4 by using the autofocus module 4-4, in conjunction with the precision positional calibration and the surface topography parameters, the global gap data between the mask 4-3 and the substrate 5-4 can be obtained without any special processing of the mask 4-3 and the substrate 5-4, which realizes the nanometric-precision inspection of the focal plane in the exposure field, thereby solving the problem of inaccurate measurement results obtained by using a single measurement point outside the pattern region, and also solving the problem of affecting the pattern layout of the mask when fabricating openings in the pattern region of the mask.

Based on the above embodiment, as shown in FIG. 2, the mask frame 4 further includes: a support plate 4-1 mounted on the upper substrate of the support frame 3, and a mask holder 4-2 mounted on the support plate 4-1, wherein the mask 4-3 is vacuum-chucked on the mask holder 4-2 and the autofocus module 4-4 is mounted on the support plate 4-1.

A metal film layer is coated on the lower surface of the mask 4-3, and a pattern to be exposed is prepared. The autofocus module 4-4 is mounted on the support plate 4-1; at least three groups of the autofocus modules 4-4 are provided, and are configured to monitor the overall gap and inclination between the mask 4-3 and the substrate 5-4 in real time; and the autofocus modules 4-4 are arranged outside the pattern region of the mask 4-3.

Based on the above embodiments, as shown in FIG. 3, the wafer stage module 5 further includes: a coarse stage 5-1 mounted on a lower substrate of the support frame 3, and a fine stage 5-2 mounted on the coarse stage 5-1, wherein the coarse stage 5-1 and the fine stage 5-2 are configured to adjust the position and the orientation of the substrate 5-4, and a wafer chuck 5-3 is mounted on the fine stage 5-2.

The control system 8 controls the coarse stage 5-1 and the fine stage 5-2 to different positions according to control requirements of travel range and precision, and at the same time adjusts the orientation of the substrate 5-4, such as the circumferential angle or the pitching angle.

Based on the above embodiments, the front-side surface topography inspection module 6 is one of a mechanical phase-shifting laser interferometer, a dynamic phase-shifting laser interferometer, a Twyman-Green-type dynamic phase-shifting interferometer, and a short-coherence Fizeau-type laser interferometer.

The front-side surface topography inspection module 6 can be selected as a large-aperture surface-topography inspection module, so as to perform a single-shot surface topography inspection on the substrate 5-4 to obtain the primary surface topography parameters; or it can also be selected as a small-aperture surface topography inspection module, and the wafer stage module 5 drives the substrate 5-4 to perform step-and-scan stitching, so that the primary surface topography parameters is obtained by multiple topography inspections. The laser interferometer has advantages of a large measurement field of view and high accuracy, and a variety of laser interferometers can be applied in the gap inspection system and method of the present disclosure.

Figure 5:
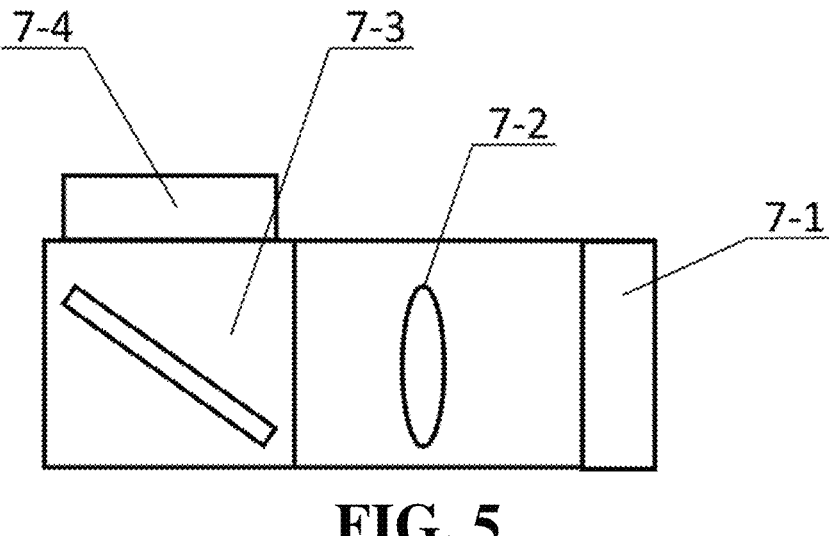
FIG. 5 schematically shows a structure schematic diagram of a folding surface topography inspection module in a gap inspection system according to the embodiments of the present disclosure.

Based on the above embodiments, as shown in FIG. 5, the folding surface topography inspection module includes: a position adjustment mechanism 7-1 mounted on a side substrate of the support frame 3 and configured to drive the folding surface topography inspection module to switch between the inspection position and the retract position; and a surface topography inspection lens group 7-2, a beam-steering mirror group 7-3, and a reference mirror group 7-4, for optical path deflection by 90° to enable surface topography inspection of the mask.

The folding surface topography inspection module deflects the optical path of the reference-grade interferometer by 90° for measurement, which reduces the complexity of the device layout in the vertical direction at the inspection position, and facilitates the position switching of the folding surface topography inspection module. Specifically, the beam-steering mirror group 7-3 is mounted on the back end of the folding surface topography inspection module, and the reference mirror group 7-4 is mounted on the beam-steering mirror group 7-3. The position adjustment mechanism 7-1 can drive the folding surface topography inspection module to move to the inspection position of the surface-topography of the mask 4-3 where the inspection is performed. After the inspection is completed, the position adjustment mechanism 7-1 drives the folding surface topography inspection module away from the inspection position and switches to the retract position. The moving method includes linear moving in and out or rotary moving in and out.

Based on the above embodiments, the folding surface topography inspection module is a upright folding surface topography inspection module 7A or an inverted folding surface topography inspection module 7B, and the folding surface topography inspection module moves linearly or rotationally by a position adjustment mechanism 7-1, so as to switch between the inspection position and the retract position.

The position adjustment mechanism 7-1 can drive the folding surface topography inspection module to move, so as to switch the position of the upright folding surface topography inspection module 7A or the inverted folding surface topography inspection module 7B. When the mask 4-3 is replaced, the position adjustment mechanism 7-1 is switched to the inspection position, i.e., directly above or directly below the mask 4-3, so as to inspect the surface topography of the pattern region of the mask 4-3. When exposure, the position adjustment mechanism 7-1 switches to the retract position, and it will not interfere with illumination, the inspection system, and the stepping of the wafer stage. The upright folding surface topography inspection module 7A needs to pass through the substrate of the mask 4-3 to inspect the surface topography of the pattern region, and the surface topography of lower surface of the substrate of the mask 4-3 (i.e., the connection surface of the metal film layer and the substrate of the mask) is inspected. In order to avoid the influence of the metal film layer thickness on the surface-topography inspection results, the metal film layer thickness deviation should be controlled as small as possible. The typical requirement is that the thickness deviation is less than 1 nm over a 50 mm diameter area.

Based on the above embodiments, the gap inspection system further includes: a vibration-isolated foundation 1 and an active vibration isolation platform 2, which constitute a system frame together with the support frame 3 for providing a stable metrology reference base and structural mounting interface.

The vibration-isolated foundation 1, the active vibration isolation platform 2, and the support frame 3 are mounted in a constant temperature, humidity, and ultra-clean environment, which provides a stable inspecting condition for the entire system and provides the mounting base and the frames for the component.

Figure 6:
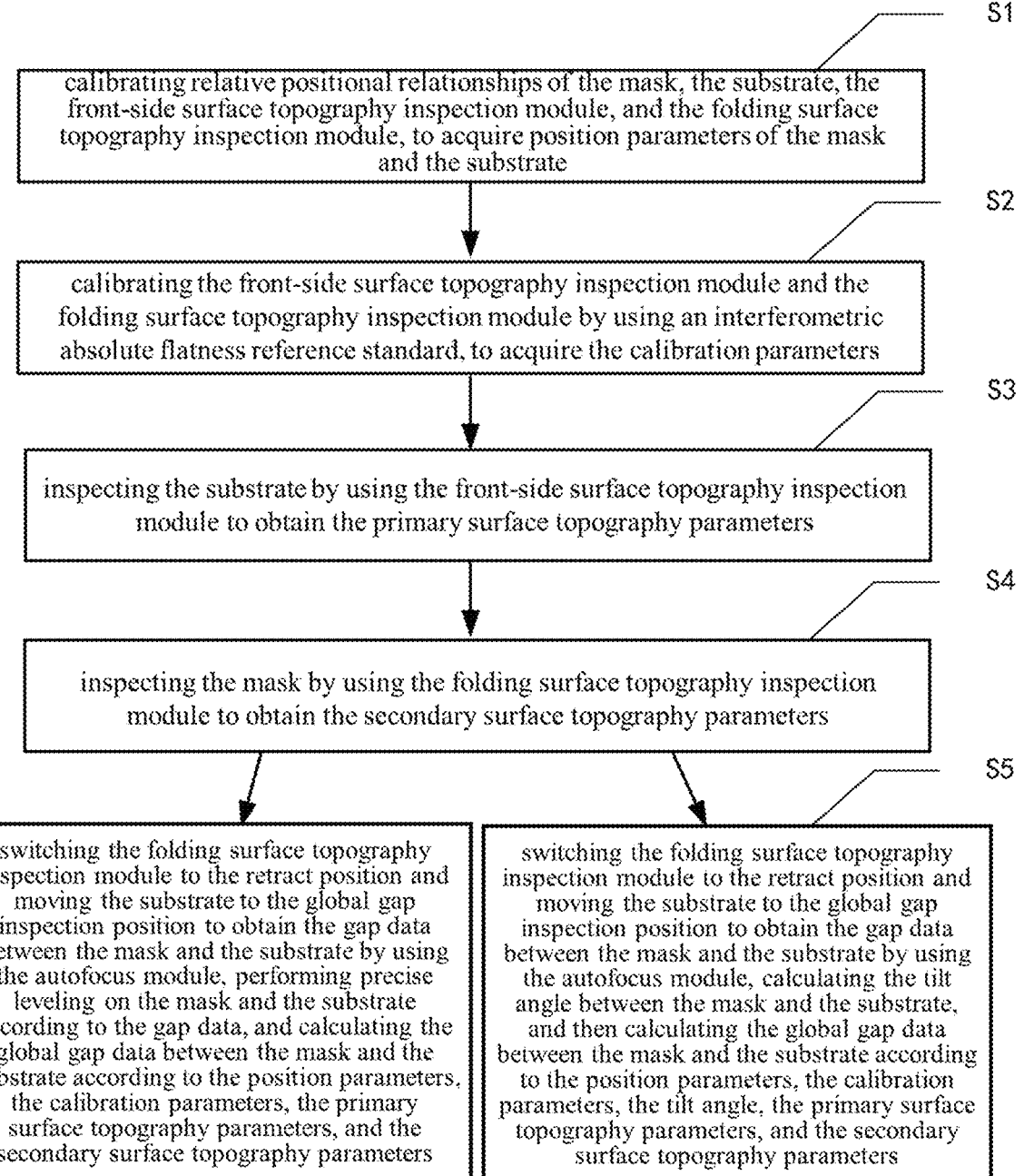
FIG. 6 schematically shows a flow schematic diagram of a method for gap inspection based on the gap inspection system according to the embodiments of the present disclosure.

The present disclosure further provides a method for gap inspection based on the forgoing gap inspection system, as shown in FIG. 6, including: S1, calibrating relative positional relationships of the mask 4-3, the substrate 5-4, the front-side surface topography inspection module 6, and the folding surface topography inspection module, to acquire position parameters of the mask 4-3 and the substrate 5-4; S2, calibrating the front-side surface topography inspection module 6 and the folding surface topography inspection module by using an interferometric absolute flatness reference standard to acquire the calibration parameters; S3, inspecting the substrate 5-4 by using the front-side surface topography inspection module 6 to obtain the primary surface topography parameters; S4, inspecting the mask 4-3 by using the folding surface topography inspection module to obtain the secondary surface topography parameters; and S5, switching the folding surface topography inspection module to the retract position and moving the substrate 5-4 to the global gap inspection position to obtain the gap data between the mask 4-3 and the substrate 5-4 by using the autofocus module 4-4, performing precise leveling on the mask 4-3 and the substrate 5-4 according to the gap data to make the mask 4-3 and the substrate 5-4 parallel to each other, and calculating the global gap data between the mask 4-3 and the substrate 5-4 according to the position parameters, the calibration parameters, the primary surface topography parameters, and the secondary surface topography parameters; or, switching the folding surface topography inspection module to the retract position and moving the substrate 5-4 to the global gap inspection position to obtain the gap data between the mask 4-3 and the substrate 5-4 by using the autofocus module 4-4, calculating the tilt angle between the mask 4-3 and the substrate 5-4, and then calculating the global gap data between the mask 4-3 and the substrate 5-4 according to the position parameters, the calibration parameters, the tilt angle, the primary surface topography parameters, and the secondary surface topography parameters.

The gap inspection method first obtains the position parameters of the mask 4-3 and the substrate 5-4 and the calibration parameters of the front-side surface topography inspection module 6 and the folding surface topography inspection module (to eliminate systematic errors), and then inspects the primary surface topography parameters of the substrate 5-4 and the secondary surface topography parameters of the mask 4-3. After the acquisition of the surface topography parameters, the folding surface topography inspection module is switched to the retract position, and the substrate 5-4 is moved to the global gap inspection position, i.e., directly below the mask 4-3. The subsequent calculations of the global gap data include two solutions as follows. The first solution is to perform precise leveling on the mask 4-3 and the substrate 5-4 according to the obtained gap data of autofocus module 4-4, so as to eliminate the tilt angle between the mask 4-3 and the substrate 5-4, so that the mask 4-3 and the substrate 5-4 are parallel to each other. The reason for perform precise leveling is that there is a tilt angle between the mask 4-3 and the substrate 5-4, where the gap data calculated at a position according to the primary surface topography parameters and the secondary surface topography parameters is not the real global gap data. Therefore, after the mask 4-3 and substrate 5-4 are parallel to each other, it needs to calculate the global gap data between mask 4-3 and substrate 5-4 according to the position parameters, the calibration parameters, the primary surface topography parameters, and the secondary surface topography parameters. The second solution is to calculate the tilt angle by using the gap data inspected by the autofocus module 4-4 at first, and then to calculate the global gap data between the mask 4-3 and the substrate 5-4 (i.e., the global gap data that is obtained by eliminating the tilt angle when performing the surface-topography calculation) according to the position parameters, the calibration parameters, the tilt angle, the primary surface topography parameters, and the secondary surface topography parameters.

In the present disclosure, the measurement of distance between the substrate 5-4 and the mask 4-3 is converted into separately measuring surface topography of the substrate 5-4 and the mask 4-3 at two spatially separated locations, and after the horizontal positions of the substrate 5-4 and the mask 4-3 are in one-to-one correspondence, the distance between the two plates is obtained according to the surface topography parameters of the two plates. Therefore, it solves the problem of limited mounting positions of the conventional gap inspection devices, and also solves the problem of the influence on the mask pattern region caused by the fabricating openings on the mask pattern surface.

Based on the above embodiments, the front-side surface topography inspection module 6 is a small-aperture surface topography inspection module, and the S3 includes: performing a full-aperture stitching inspection on the substrate 5-4 by using the small-aperture surface topography inspection module, to acquire surface topography parameters of each stitched sub-area; selecting surface topography parameters of a non-overlapping region as primary stitching data at the non-overlapping region of the stitched sub-area, and selecting surface topography parameters of a stitched sub-area farther from an edge of stitched sub-areas as secondary stitching data at an overlapping region of the stitched sub-area; and merging the primary stitching data and the secondary stitching data to obtain the primary surface topography parameters.

Figure 4:
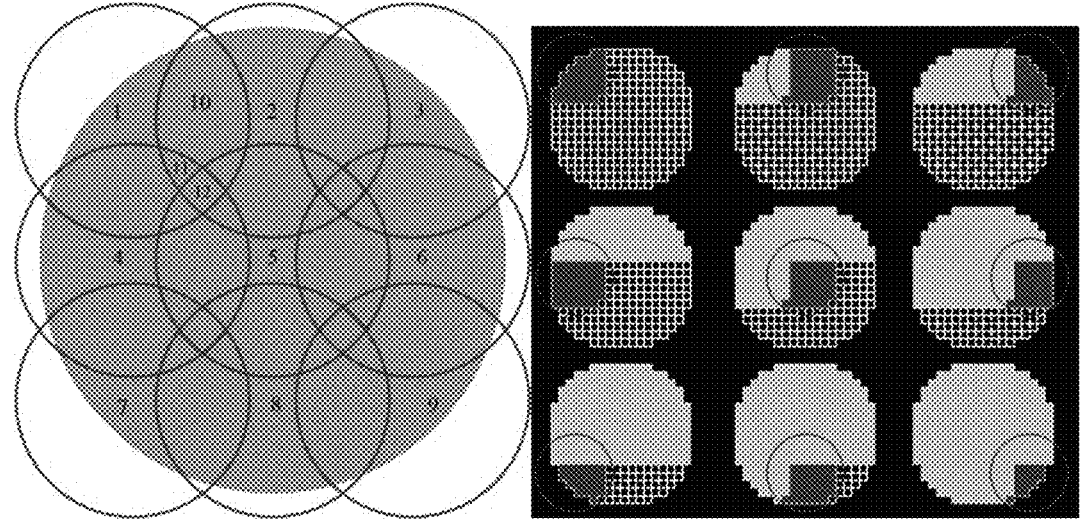
FIG. 4 schematically shows a schematic diagram of local region division and data selection when a front-side surface topography inspection module is a small-aperture surface topography inspection module and a schematic diagram of performing full-aperture substrate stitching inspection according to the embodiments of the present disclosure.

When the front-side surface topography inspection module 6 is a small-aperture surface topography inspection module, as shown in FIG. 4, in which, for example, the substrate 5-4 is an 8-inch substrate, the full-aperture stitching inspection is accomplished by a total of 9 (i.e., 3×3) fields, thus obtaining the full-aperture surface topography parameters. In order to avoid the stitching process affecting the accuracy of the data, the local region surface topography parameters in the 9 fields are optimally selected. Any field of the inspection data can be selected when the data is not just at the stitching position. It ensures the use of the original data of a single-field inspection of the front-side surface topography inspection module 6, and also ensures that the local region can cover the entire 8-inch substrate 5-4.

As shown in the left part of FIG. 4, among the 9 fields, those that do not have overlapping regions with other fields are directly used for the stitching of the surface topography. For fields with overlapping regions, after the overlapping regions are aligned (usually the surface topography parameters between different fields are aligned by taking the surface topography of a center part of the overlapping region as a characteristic), the surface topography parameters are extracted from the fields having the overlapping regions away from the respective field edges, so as to perform stitching of full-aperture surface topography. For example, in the overlapping region 10, the left side is close to the edge of the 2nd field, and the right side is close to the edge of the 1st field. After aligning the overlapping regions of the 1st field and the 2nd field according to the surface topography parameters of the center part of the overlapping region 10, at points where the surface topography parameters of the two fields are different, the surface topography parameters on the left side of the overlapping region 10 is prioritized to use the raw surface topography inspection parameters inspected in the 1st field, and the surface topography parameters on the right side of the overlapping region 10 is prioritized to use the raw surface topography inspection parameters inspected in the 2nd field. The surface topography parameters of the overlapping region 11 among three fields and surface topography parameters of the overlapping region 12 among four fields are obtained in the same way. The distance of a point in the overlapping region away from an edge of a field can be determined according to the distance between the point and the center of the field. For example, the distance between a point in the overlapping region 10 and the center of the 1st field is L1 and the distance between the point and the center of the 2nd field is L2. If L1 is smaller than L2, when the surface topography parameters of the point in the two fields are different, the raw surface topography inspection parameters in the 1st field are selected as the data required for the stitching. The right part of FIG. 4 shows a schematic diagram of the stitching inspection of the full-aperture substrate accomplished by a total of 9 (3×3) fields when the front-side surface topography inspection module 6 is a small-aperture surface topography inspection module.

The present disclosure further provides a method of performing focal plane correction according to the forgoing gap inspection system, including: S1, calibrating relative positional relationships of the mask 4-3, the substrate 5-4, the front-side surface topography inspection module 6, and the folding surface topography inspection module, to acquire position parameters of the mask 4-3 and the substrate 5-4; S2, calibrating the front-side surface topography inspection module 6 and the folding surface topography inspection module by using an interferometric absolute flatness reference standard to acquire the calibration parameters; S3, inspecting the substrate 5-4 by using the front-side surface topography inspection module 6 to obtain the primary surface topography parameters; S4, inspecting the mask 4-3 by using the folding surface topography inspection module to obtain the secondary surface topography parameters; S5, switching the folding surface topography inspection module to the retract position and moving the substrate 5-4 to the global gap inspection position to monitor the gap data between the mask 4-3 and the substrate 5-4 by using the autofocus module 4-4, performing precise leveling on the mask 4-3 and the substrate 5-4 according to the gap data to make the mask 4-3 and the substrate 5-4 parallel to each other, and calculating the global gap data between the mask 4-3 and the substrate 5-4 according to the position parameters, the calibration parameters, the primary surface topography parameters, and the secondary surface topography parameters; or, switching the folding surface topography inspection module to the retract position and moving the substrate 5-4 to the global gap inspection position to obtain the gap data between the mask 4-3 and the substrate 5-4 by using the autofocus module 4-4, calculating the tilt angle between the mask 4-3 and the substrate 5-4, and then calculating the global gap data between the mask 4-3 and the substrate 5-4 according to the position parameters, the calibration parameters, the tilt angle, the primary surface topography parameters, and the secondary surface topography parameters; and S6, performing the focal plane correction according to the global gap data, so that an upper surface of the substrate 5-4 is located on a target focal plane.

Further, the global gap data obtained according to S1-S5 above can be further used to perform a focal plane correction, so that the upper surface of the substrate 5-4 is located on the target focal plane to realize the optimal exposure effect. Steps S1-S5 are the same as the forgoing gap inspection method, and are not repeated herein.

The present disclosure is further described below by specific embodiments. The above gap inspection system and the method, and the focal plane correction method are specified in the following embodiments. However, the following embodiments are used only to illustrate the present disclosure, and the scope of the present disclosure is not limited thereto.

As shown in FIG. 1, in the present embodiment, the overall structure includes a vibration-isolated foundation 1, an active vibration isolation platform 2, a support frame 3, a mask frame 4, a wafer stage module 5, a control system 8, a front-side surface topography inspection module 6, and an upright folding surface topography inspection module 7A (or an inverted folding surface topography inspection module 7B), wherein the gap inspection system is composed of the mask frame 4, the wafer stage module 5, the control system 8, the front-side surface topography inspection module 6, the upright folding surface topography inspection module 7A (or the inverted folding surface topography inspection module 7B); the mask 4-3 is vacuum-chucked on the mask frame 4; and the substrate 5-4 is carried on the wafer stage module 5.

As shown in FIG. 2 and FIG. 3, the vibration-isolated foundation 1, the active vibration isolation platform 2, and the support frame 3 are assembled to form the system frame. The mask frame 4 includes a support plate 4-1, a mask holder 4-2, and an autofocus module 4-4. Three groups of the same autofocus modules 4-4 are mounted on the support plate 4-1, and are configured to monitor the overall gap and inclination between the mask 4-3 and the substrate 5-4 in real time. The wafer stage module 5 includes a coarse stage 5-1, a fine stage 5-2, and a wafer chuck 5-3, wherein the coarse stage 5-1 and the fine stage 5-2 are configured to adjust the position and the orientation of the substrate 5-4. The front-side surface topography inspection module 6 can be selected as a large-aperture surface topography inspection module, so as to perform a single-shot surface topography inspection on the substrate 5-4; or it can also be selected as a small-aperture surface topography inspection module, and the wafer stage module 5 drives the substrate 5-4 to perform step-and-scan stitching. Therefore, the surface topography inspection is completed by performing multiple inspections across the surface topography, to acquire primary surface topography parameters. The folding surface topography inspection module includes a position adjustment mechanism 7-1, a surface topography inspection lens group 7-2, a beam-steering mirror group 7-3, and a reference mirror group 7-4, and is configured to deflect the optical path by 90° for the surface topography inspection of the mask 4-3. The control system 8 acquires the position parameters of the mask 4-3 and the substrate 5-4 and calibration parameters of the front-side surface topography inspection module 6 and the folding surface topography inspection module, and is configured to calculate global gap data between the mask 4-3 and the substrate 5-4 in conjunction with the position parameters, the calibration parameters, the primary surface topography parameters, and the secondary surface topography parameters after measuring the tilt angle between the mask 4-3 and the substrate 5-4.

The steps based on the gap inspection system and method, and the focal plane correction method are as follows, including step 1-step 7.

Step 1: arranging the mask 4-3 and the substrate 5-4 by the transmission system. In order to subsequently obtain the gap therebetween according to the surface topography parameters of the mask 4-3 and the substrate 5-4, it is necessary to strictly control errors of the two when loading them.

Step 2: calibrating the relative positional relationships in the XY direction and the TZ direction among the front-side surface topography inspection module 6, the upright folding surface topography inspection module 7A or the inverted folding surface topography inspection module 7B, the mask 4-3, and the substrate 5-4 by pattern markers on the wafer stage module 5, the mask 4-3 and the substrate 5-4, so as to ensure that the positions of the mask 4-3 and the substrate 5-4 are in one-to-one correspondence when they are inspected and exposed, and recording the position parameters (x, y) of the mask 4-3 and the substrate 5-4 by the control system 8. It is equivalent to the above step S1.

Step 3: calibrating the front-side surface topography inspection module 6, the reference mirror groups 7-4 of the upright folding surface topography inspection module 7A or the inverted folding surface topography inspection module 7B by using a process of the interferometric absolute flatness reference standard, and recording the calibration parameters S(x, y) by the control system 8, wherein S(x, y) is the calibration parameters S1(x, y) of the front-side surface topography inspection module 6, the calibration parameters S2(x, y) of the upright folding surface topography inspection module 7A, or the calibration parameters S3(x, y) of the inverted folding surface topography inspection module 7B. It is equivalent to the above step S2.

Step 4: moving the wafer stage module 5 to the front-side surface topography inspection module 6 to complete the global surface topography inspection of the substrate 5-4, and recording the primary surface topography parameters W(x, y) by the control system 8. It is equivalent to the above step S3.

Step 5: switching the position adjustment mechanism 7-1 to the inspection position to inspect the surface topography of the pattern region of the mask 4-3, and recording the secondary surface topography parameters M(x, y) by the control system 8. It is equivalent to the above step S4.

Step 6: switching the position adjustment mechanism 7-1 to the retract position; moving the wafer stage module 5 to the global gap inspection position; and feedback controlling the wafer stage module 5 to performs precise leveling and gap control on the mask 4-3 and the substrate 5-4 by the control system 8 according to the outer three-point gap data inspected by the autofocus module 4-4, so that the mask 4-3 and the substrate 5-4 are parallel to each other.

Step 7: automatically matching the global gap data F(x, y) at any position of the current exposure region by the control system 8 according to the position parameters (x, y), the calibration parameters S(x, y), the primary surface topography parameters W(x, y) obtained by the front-side surface topography inspection module 6, and the secondary surface topography parameters M(x, y) obtained by the folding surface topography inspection module. It is equivalent to the above step S5.

Step 8: determining, by the control system 8 according to the global gap data F(x, y), whether the light field modulation or the focal plane active control mechanism is needed for the focal plane correction to realize the optimal exposure effect. It is equivalent to the above step S6.

The present disclosure further verifies the feasibility of the gap inspection method and the focal plane correction method. As shown in Table 1, it gives the results of the focal plane inspection under different gaps. When the average gaps are 102.7 nm, 94.3 nm, 84.5 nm, and 77.3 nm, the deviations of PV and RMS values of the corresponding focal plane inspection are less than 0.4 nm, which demonstrates that the method provided by the present disclosure has a good consistency in the focal plane inspection and reliability in the focal plane correction.

TABLE 1

| Test serial number | Average gap value/nm | PV value/nm | RMS value/nm |
|---|---|---|---|
| 1 | 102.7 | 24.31 | 3.66 |
| 2 | 94.3 | 24.01 | 3.79 |
| 3 | 84.5 | 24.36 | 3.93 |
| 4 | 77.3 | 24.67 | 3.94 |

The above specific embodiments provide a further detailed description of the purpose, technical solutions, and beneficial effects of the present disclosure. It should be understood that the above specific embodiments are only specific embodiments of the present disclosure and are not intended to limit the present disclosure. Any modifications, equivalent replacements, improvements, etc., made within the spirit and principles of the present disclosure, shall be included within the scope of protection of the present disclosure.

The invention claimed is:

1. A gap inspection system, configured to inspect global gap data between a mask and a substrate, comprising:
   a support frame;
   a mask frame, comprising an autofocus module for real-time monitoring the gap data between the mask and the substrate;
   a wafer stage module, comprising a wafer chuck for adjusting a position and an orientation of the substrate;
   a front-side surface topography inspection module, mounted on an upper substrate of the support frame for inspecting the substrate, to acquire primary surface topography parameters;
   a folding surface topography inspection module, switchable between an inspection position and a retract position for inspecting the mask, to acquire secondary surface topography parameters; and
   a control system, configured to acquire position parameters of the mask and the substrate and calibration parameters of the front-side surface topography inspection module and the folding surface topography inspection module, and configured to calculate global gap data between the mask and the substrate in conjunction with the position parameters, the calibration parameters, the primary surface topography parameters, and the secondary surface topography parameters after measuring a tilt angle between the mask and the substrate.

2. The gap inspection system according to claim 1, wherein the mask frame further comprises:
   a support plate, mounted on the upper substrate of the support frame, and
   a mask holder, mounted on the support plate, wherein the mask is vacuum-chucked on the mask holder and the autofocus module is mounted on the support plate.

3. The gap inspection system according to claim 1, wherein the wafer stage module further comprises:
   a coarse stage, mounted on a lower substrate of the support frame, and
   a fine stage, mounted on the coarse stage, wherein
   the coarse stage and the fine stage are configured to adjust the position and the orientation of the substrate, and the wafer chuck is mounted on the fine stage.

4. The gap inspection system according to claim 1, wherein the front-side surface topography inspection module is one of a mechanical phase-shifting laser interferometer, a dynamic phase-shifting laser interferometer, a Twyman-Green-type dynamic phase-shifting interferometer, and a short-coherence Fizeau-type laser interferometer.

5. The gap inspection system according to claim 1, wherein the folding surface topography inspection module comprises:
   a position adjustment mechanism, mounted on a side substrate of the support frame, and configured to drive the folding surface topography inspection module to switch between the inspection position and the retract position; and
   a surface topography inspection lens group, a beam-steering mirror group, and a reference mirror group, for optical path deflection by 90° to enable surface topography inspection of the mask.

6. The gap inspection system according to claim 5, wherein the folding surface topography inspection module is an upright folding surface topography inspection module or an inverted folding surface topography inspection module, and
   the folding surface topography inspection module moves linearly or rotationally by the position adjustment mechanism, so as to switch the positions between the inspection position and the retract position.

7. The gap inspection system according to claim 1, wherein the gap inspection system further comprises:
   a vibration-isolated foundation and an active vibration isolation platform, constituting a system frame together with the support frame for providing a stable metrology reference base and structural mounting interface.

8. A method for gap inspection based on the gap inspection system according to claim 1, comprising:
   S1, calibrating relative positional relationships of the mask, the substrate, the front-side surface topography inspection module, and the folding surface topography inspection module, to acquire position parameters of the mask and the substrate;
   S2, calibrating the front-side surface topography inspection module and the folding surface topography inspection module by using an interferometric absolute flatness reference standard, to acquire the calibration parameters;
   S3, inspecting the substrate by using the front-side surface topography inspection module to obtain the primary surface topography parameters;
   S4, inspecting the mask by using the folding surface topography inspection module to obtain the secondary surface topography parameters;
   S5, switching the folding surface topography inspection module to the retract position and moving the substrate to a global gap inspection position to obtain the gap data between the mask and the substrate by using the autofocus module, performing precise leveling on the mask and the substrate according to the gap data to make the mask and the substrate parallel to each other, and calculating a global gap data between the mask and the substrate according to the position parameters, the calibration parameters, the primary surface topography parameters, and the secondary surface topography parameters; or switching the folding surface topography inspection module to the retract position and moving the substrate to the global gap inspection position to obtain the gap data between the mask and the substrate by using the autofocus module, calculating a tilt angle between the mask and the substrate, and then calculating the global gap data between the mask and the substrate according to the position parameters, the calibration parameters, the tilt angle, the primary surface topography parameters, and the secondary surface topography parameters.

9. The method for the gap inspection according to claim 8, wherein the front-side surface topography inspection module is a small-aperture surface topography inspection module, and the S3 comprises:

performing a full-aperture stitching inspection on the substrate by using the small-aperture surface topography inspection module, to acquire surface topography parameters of each stitched sub-area;

using surface topography parameters of a non-overlapping region as primary stitching data at a non-overlapping region of the stitched sub-area, and selecting surface topography parameters of a stitched sub-area farther from an edge of stitched sub-areas as secondary stitching data at an overlapping region of the stitched sub-area; and merging the primary stitching data and the secondary stitching data to obtain the primary surface topography parameters.

10. A method for focal plane correction based on the gap inspection system according to claim 1, comprising:

S1, calibrating relative positional relationships of the mask, the substrate, the front-side surface topography inspection module, and the folding surface topography inspection module, to acquire position parameters of the mask and the substrate;

S2, calibrating the front-side surface topography inspection module and the folding surface topography inspection module by using an interferometric absolute flatness reference standard, to acquire the calibration parameters;

S3, inspecting the substrate by using the front-side surface topography inspection module to obtain the primary surface topography parameters;

S4, inspecting the mask by using the folding surface topography inspection module to obtain the secondary surface topography parameters;

S5, switching the folding surface topography inspection module to the retract position and moving the substrate to a global gap inspection position to obtain the gap data between the mask and the substrate by using the autofocus module, performing precise leveling on the mask and the substrate according to the gap data to make the mask and the substrate parallel to each other, and calculating a global gap data between the mask and the substrate according to the position parameters, the calibration parameters, the primary surface topography parameters, and the secondary surface topography parameters; or switching the folding surface topography inspection module to the retract position and moving the substrate to the global gap inspection position to obtain the gap data between the mask and the substrate by using the autofocus module, calculating the tilt angle between the mask and the substrate, and then calculating the global gap data between the mask and the substrate according to the position parameters, the calibration parameters, the tilt angle, the primary surface topography parameters, and the secondary surface topography parameters; and S6, performing the focal plane correction according to the global gap data, so that an upper surface of the substrate is located on a target focal plane.

* * * * *